(12) United States Patent
Otera et al.

(10) Patent No.: US 11,243,632 B2
(45) Date of Patent: Feb. 8, 2022

(54) PIEZOELECTRIC DEVICE AND DISPLAY DEVICE

(71) Applicant: Murata Manufacturing Co., Ltd., Nagaokakyo (JP)

(72) Inventors: Shozo Otera, Nagaokakyo (JP); Takashi Kihara, Nagaokakyo (JP); Yoshihiro Yamaguchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 472 days.

(21) Appl. No.: 16/356,409

(22) Filed: Mar. 18, 2019

(65) Prior Publication Data

US 2019/0212863 A1 Jul. 11, 2019

Related U.S. Application Data

(63) Continuation of application No. PCT/JP2017/033396, filed on Sep. 15, 2017.

(30) Foreign Application Priority Data

Sep. 23, 2016 (JP) .............................. JP2016-185397

(51) Int. Cl.
| | |
|---|---|
| *H01L 41/113* | (2006.01) |
| *G06F 3/041* | (2006.01) |
| *H01L 41/04* | (2006.01) |
| *H03K 17/96* | (2006.01) |
| *H01H 13/78* | (2006.01) |
| *H01H 35/00* | (2006.01) |

(Continued)

(52) U.S. Cl.
CPC ........... *G06F 3/0414* (2013.01); *H01H 13/00* (2013.01); *H01H 13/78* (2013.01); *H01H 35/00* (2013.01); *H01L 41/042* (2013.01); *H01L 41/1132* (2013.01); *H01L 41/1138* (2013.01); *H01L 41/193* (2013.01); *H03K 17/9643* (2013.01)

(58) Field of Classification Search
CPC ......................... H01L 41/1132; H01L 41/1138
USPC .......................................................... 310/338
See application file for complete search history.

(56) References Cited

U.S. PATENT DOCUMENTS

| | | |
|---|---|---|
| 4,328,441 A | 5/1982 | Kroeger, Jr. et al. |
| 9,909,852 B2 | 3/2018 | Hatanaka et al. |

(Continued)

FOREIGN PATENT DOCUMENTS

| | | |
|---|---|---|
| JP | S51138327 A | 11/1976 |
| JP | S57500039 A | 1/1982 |

(Continued)

OTHER PUBLICATIONS

International Search Report issued in PCT/JP2017/033396, dated Nov. 28, 2017.

(Continued)

*Primary Examiner* — Derek J Rosenau
(74) *Attorney, Agent, or Firm* — Arent Fox LLP

(57) ABSTRACT

A piezoelectric device includes a first region for receiving a pressing operation and a second region located outside of the first region. A piezoelectric element outputs a stronger potential when a pressing operation is applied to the first region than when the pressing operation is applied to the second region.

19 Claims, 10 Drawing Sheets

(51) Int. Cl.
  *H01H 13/00*  (2006.01)
  *H01L 41/193*  (2006.01)

(56) References Cited

U.S. PATENT DOCUMENTS

| | | | |
|---|---|---|---|
| 2011/0121591 A1* | 5/2011 | Nishiwaki | H01L 41/1132 |
| | | | 294/86.4 |
| 2015/0106051 A1 | 4/2015 | Hatanaka et al. | |
| 2017/0176268 A1 | 6/2017 | Kihara et al. | |
| 2017/0177106 A1 | 6/2017 | Kihara | |

FOREIGN PATENT DOCUMENTS

| | | |
|---|---|---|
| WO | 2013128819 A1 | 9/2013 |
| WO | 2016035682 A1 | 3/2016 |
| WO | 2016038951 A | 3/2016 |

OTHER PUBLICATIONS

Written Opinion of the International Searching Authority issued in PCT/JP2017/033396, dated Nov. 28, 2017.

\* cited by examiner

PIEZOELECTRIC DEVICE AND DISPLAY DEVICE

CROSS REFERENCE TO RELATED APPLICATIONS

The present application is a continuation of International application No. PCT/JP2017/033396, filed Sep. 15, 2017, which claims priority to Japanese Patent Application No. 2016-185397, filed Sep. 23, 2016, the entire contents of each of which are incorporated herein by reference.

TECHNICAL FIELD

One embodiment of the present invention relates to a piezoelectric device including a piezoelectric element and a display device using the piezoelectric device.

BACKGROUND ART

WO 2016/038951 A (Patent Document 1) discloses a holding state detection device that detects a holding state by using a piezoelectric sensor attached to a housing. In that device, a piezoelectric film containing polylactic acid (PLLA) as a main component which is stretched in a uniaxial direction is used as a piezoelectric sensor. When a pressure is applied to the housing, the housing is distorted, and this distortion is transmitted to the piezoelectric film, so that positive and negative charges are generated. By detecting the generated charge, that is, a change in an output voltage in the piezoelectric sensor, a pressing force on the piezoelectric film is detected. In this manner, it is possible to directly and instantaneously detect a state in which an operator holds the housing.

In this device, when a part of the housing is pressed, a peripheral portion, other than the pressed portion, is also distorted. Whether the pressed position is a specific region of the housing or in other regions, a charge is generated from the piezoelectric film, and a pressing force applied to the housing is detected. It is sometimes desirable to use holding state detection device as a switch which detects when a specific region of the housing has been pressed. It is difficult to use the holding state detection device described in Patent Document 1 as a switch for determining whether a specific location on the housing is pressed (and using that information to indicate that a switch has been pressed) because the pressing force is detected regardless of the position on the housing that is pressed. One possible way to overcome this problem is to look for a pressing force that exceeds a threshold value by a predetermined amount. However, since there is an individual difference in the strength of a pressing force, so setting of the threshold value is difficult. As a result, there is room for improvement in determining whether an operator has pressed a specific region of the housing or a region other than the specific region.

An object of an embodiment of the present invention is to provide a piezoelectric device capable of detecting deformation of a local specific region.

A piezoelectric device according to an embodiment of the present invention includes a first region for receiving a pressing operation, a second region other than the first region, and a piezoelectric element that outputs a relatively strong potential when receiving a pressing operation on the first region as compared with when receiving a pressing operation on the second region.

In this configuration, when the first region receives a pressing operation, the piezoelectric element outputs a relatively strong potential as compared with when the second region receives a pressing operation. For this reason, depending on the magnitude of a potential outputted by the piezoelectric element, it can be clearly determined whether or not the first region is pressed. As a result, it is possible to detect local deformation of a specific region.

It is preferable that the piezoelectric device includes a plurality of the first regions.

A display device according to an embodiment of the present invention uses the piezoelectric device.

In this configuration, since the piezoelectric device is used, when the first region of the display device receives a pressing operation, the piezoelectric element outputs a relatively strong potential as compared with when the second region receives a pressing operation. For this reason, depending on the magnitude of a potential outputted by the piezoelectric element, it can be clearly determined whether or not the first region is pressed. As a result, it is possible to detect deformation of a local specific region in the display device.

According to an embodiment of the present invention, deformation of a local region can be detected.

DESCRIPTION OF THE PREFERRED EMBODIMENTS

Figure 1A:
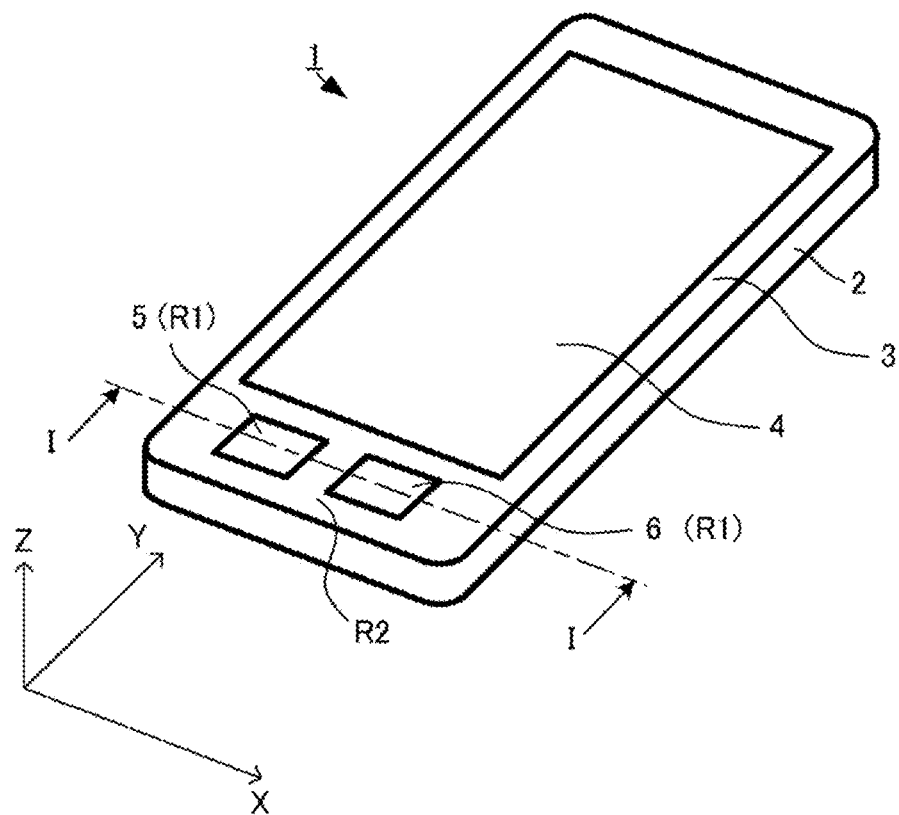
FIG. 1(A) is a perspective view of a display device including a piezoelectric device according to a first embodiment.
Figure 1B:
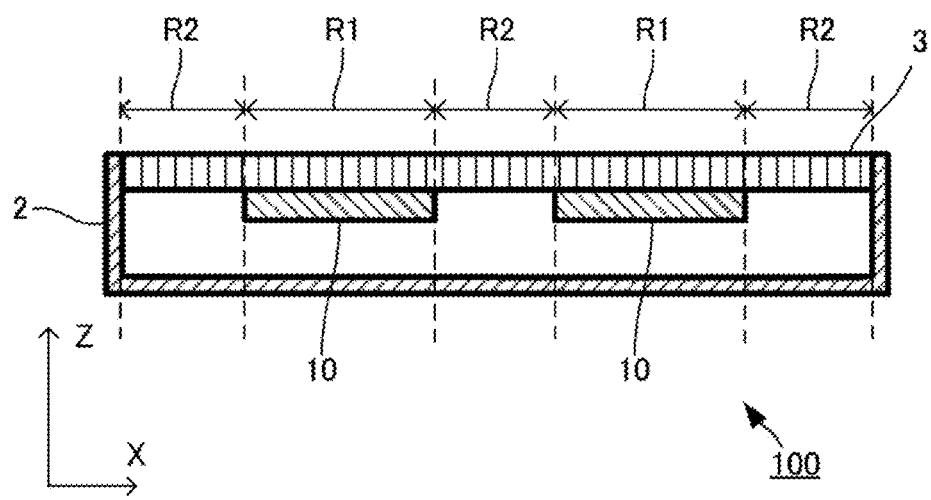
FIG. 1(B) is a cross-sectional view of the display device.
Figure 2A:
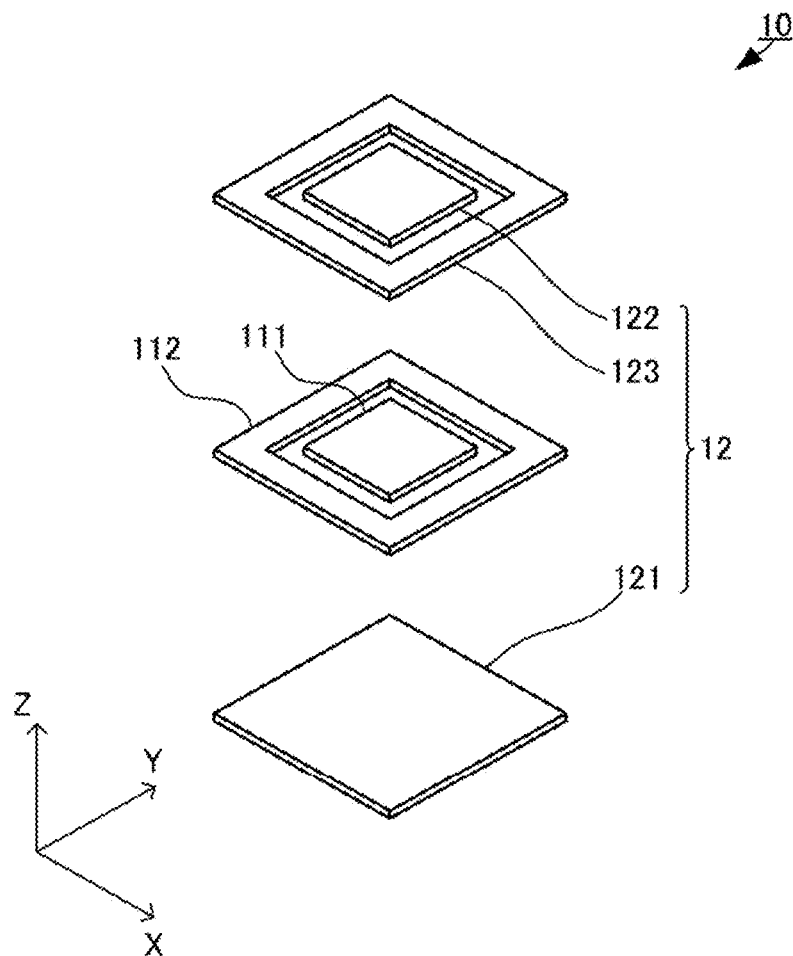
FIG. 2(A) is an exploded perspective view of a piezoelectric element according to the first embodiment.
Figure 2B:
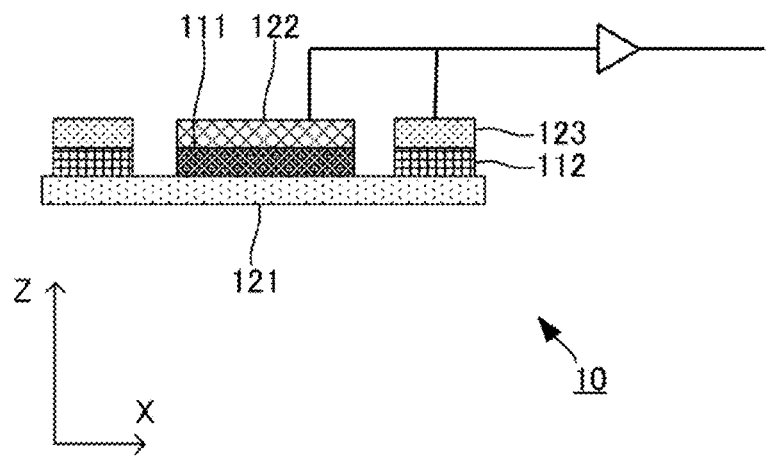
FIG. 2(B) is a cross-sectional view of the piezoelectric element.

FIG. 1(A) is a perspective view of a display device including a piezoelectric device according to a first embodiment, and FIG. 1(B) is a cross-sectional view taken along line I-I shown in FIG. 1(A). FIG. 2(A) is an exploded perspective view of a piezoelectric element according to the first embodiment, and FIG. 2(B) is a cross-sectional view on an X-Z plane of the piezoelectric element. It is to be noted that the piezoelectric device shown in FIG. 2 is merely an example, and the present invention is not limited thereto, and can be appropriately changed in accordance with the specifications.

As shown in FIG. 1(A), a display device 1 preferably includes a housing 2 having a substantially rectangular parallelepiped shape with an open upper surface. The display device 1 includes a flat plate-shaped front panel 3 disposed on an opening on the upper surface of the housing 2. The front panel 3 functions as an operation surface on which a user performs a touch operation using a finger, a pen, or the like. In the following description, it is assumed that a width direction (lateral direction) of the housing 2 is an X direction, a length direction (vertical direction) is a Y direction, and a thickness direction is a Z direction. The X direction is sometimes referred to herein as a "first direction" and the Y direction is sometimes referred to herein as a "second direction".

A display portion 4, a first pressing portion 5, and a second pressing portion 6 are formed on the operation surface of the front panel 3. In the present embodiment, the first pressing portion 5 and the second pressing portion 6 have a square shape in plan view and are formed side by side in the X direction at a predetermined interval. For example, the first pressing portion 5 functions as a "Home" button and the second pressing portion 6 functions as a "return" button. The first and second pressing portions 5 and 6 are each sometimes referred to herein as a "first region R1" which receives a pressing operation. A region other than the first region that receives a pressing operation (including the pressing portion 5 or 6 that does not receive the pressing operation) on the front panel 3 (excluding the display portion 4) is sometimes referred to herein as a "second region R2". That is, the "first region R1" is either the first pressing portion 5 or the second pressing portion 6, and the "second region R2" is a region excluding the first region R1 on the front panel 3 (excluding the display portion 4) of the operation surface. In the present embodiment two pressing portions (the first and second pressing portions 5 and 6) are provided. However, only a single pressing portion or three or more pressing portion may be provided. In addition, each of the pressing portions may be disposed at any position other than the display portion 4 on the operation surface of the front panel 3. In the disclosed embodiment, the first and second pressing portions 5 and 6 are partial regions on the front panel 3 and are formed continuously with the front panel 3. The first pressing portion 5 and the second pressing portion 6 are distinguished from the other parts of the front panel 3 by coloring, marking, or forming grooves around a part of the front panel 3. Further, the shapes of the first pressing portion 5 and the second pressing portion 6 are not limited to a square shape, and may be a different shape, such as a circular shape.

As shown in FIG. 1(B), a piezoelectric device 100 is formed inside the housing 2 and below the front panel 3 in the Z direction. The piezoelectric device 100 includes a piezoelectric element 10 at a position corresponding to the first region R1 (in this embodiment, two piezoelectric elements are provided, one corresponding to each of the first and second pressing portions 5 and 6). When the user touches the front panel 3 with a finger, a pen, or the like, pressure is transmitted to the piezoelectric element(s) 10. As will be described in detail later, when one of the first and second pressing portions 5 or 6 receives a pressing operation (and is therefore the first region R1), the piezoelectric element 10 outputs a relatively strong potential as compared with when the second region R2 receives a pressing operation.

As shown in FIGS. 2(A) and 2(B), it is preferable that each of the piezoelectric elements 10 includes a flat film-like first piezoelectric film 111, a flat film-like second piezoelectric film 112, and an electrode 12. Note that, in FIG. 2(A), illustration of components other than the first piezoelectric film 111, the second piezoelectric film 112, and the electrode 12 is omitted. The first and second piezoelectric films 111 and 112 are disposed in the first region R1. The first piezoelectric film 111 has a square shape in plan view, similarly to a surface of the first region R1, that is, the first pressing portion 5 and the second pressing portion 6. Note that, the shape of the first piezoelectric film 111 can be changed as appropriate in accordance with the shape of the first and second pressing portions 5 and 6. In the disclosed embodiment, the second piezoelectric film 112 is formed in a shape that surrounds the first piezoelectric film 111 on the same plane as the first piezoelectric film 111, and an outer periphery of the second piezoelectric film 112 is formed to substantially coincide with an outer periphery of the first pressing portion 5 or the second pressing portion 6.

The electrode 12 includes an electrode 121, an electrode 122, and an electrode 123. The electrode 12 is formed on both principal surfaces of the first piezoelectric film 111 and the second piezoelectric film 112 so as to cover almost the entire principal surface. In detail, the electrode 121 is formed in a square shape in plan view similarly to a surface of the first region R1, and is formed so as to cover one of principal surfaces of the first piezoelectric film 111 and the second piezoelectric film 112. The electrode 122 is formed in a square shape in plan view similarly to the first piezoelectric film 111, and is formed so as to cover a principal surface, on a side on which the electrode 121 is not formed, of the first piezoelectric film 111. In addition, the electrode 123 is formed in a shape similar to that of the second piezoelectric film 112 in plan view, and is formed so as to cover a principal surface, on a side on which the electrode 121 is not formed, of the second piezoelectric film 112. Note that a structure in which edges of the first piezoelectric film 111 and the second piezoelectric film 112 are visible when viewed from the electrode 122 side and the electrode 123 side is preferable. It is possible to reduce the possibility that the electrode 121 and the electrode 122 or the electrode 123 are short-circuited due to characteristic variation caused by displacement occurring at the time of bonding or due to deformation of the piezoelectric element 10 occurring when pressing is applied.

Figure 3A:
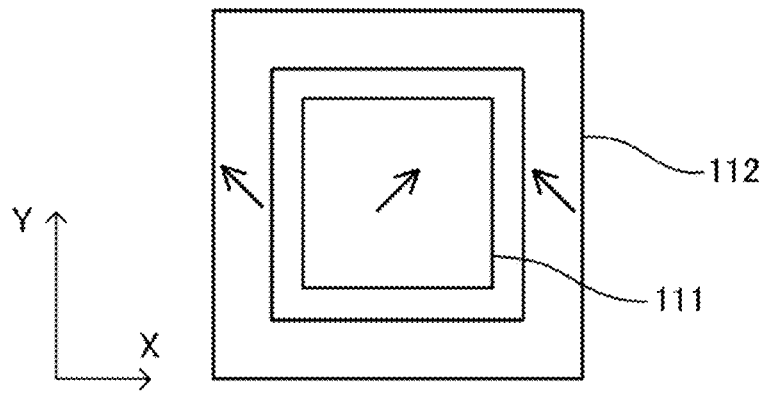
FIGS. 3(A) to 3(C) are diagrams for explaining a piezoelectric film according to the first embodiment.
Figure 3B:
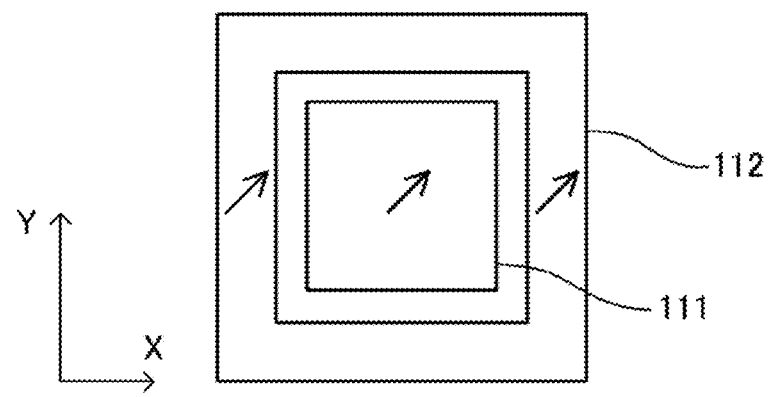
Figure 3C:
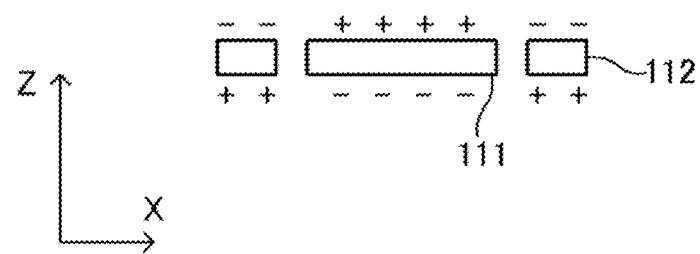

FIGS. 3(A) to 3(C) are views for explaining a piezoelectric film according to the first embodiment. FIGS. 3(A) and 3(B) are plan views of the piezoelectric film according to the first embodiment. FIG. 3(C) is a cross-sectional view on an X-Z plane of the piezoelectric film according to the first embodiment. It is preferable that the first piezoelectric film 111 generates a potential having a polarity which is opposite to the potential generated by the second piezoelectric film 112 when a pressing operation is received.

As shown in FIG. 3(A), the first and second piezoelectric films 111 and 112 are preferably made of a film formed of a chiral polymer. As the chiral polymer, polylactic acid (PLA), particularly poly-L-lactic acid (PLLA), is used in the first embodiment. In the PLLA including a chiral polymer, a main chain has a helical structure. PLLA has piezoelectricity when uniaxially stretched and molecules are oriented. Then, the uniaxially stretched PLLA generates a potential when the flat surfaces of the first piezoelectric film 111 and the second piezoelectric film 112 are pressed. At this time, a generated potential amount depends on an amount of displacement by which the flat surface is displaced in a direction orthogonal to the flat surface.

In the first embodiment, uniaxial stretching directions of the first piezoelectric film 111 and the second piezoelectric film 112 (PLLA) are directions that form an angle of 45 degrees in opposite directions with respect to the X direction and the Y direction as shown by arrows in FIG. 3(A). This angle of 45 degrees includes, for example, an angle of about 45 degrees±10 degrees. In this manner, a potential generated when the first piezoelectric film 111 is pressed and a potential generated when the second piezoelectric film 112 is pressed have opposite polarities.

In PLLA, piezoelectricity is generated by orientation treatment of molecules by stretching or the like, and there is no need to perform polling processing like other polymers such as PVDF and piezoelectric ceramics. That is, piezoelectricity of PLLA not belonging to ferroelectrics is not expressed by polarization of ions like ferroelectrics such as PVDF or PZT, but is derived from a helical structure which is a characteristic structure of a molecule. Therefore, pyroelectricity that is generated in other ferroelectric piezoelectric materials is not generated in the PLLA. Further, a change in a piezoelectric constant is observed over time in PVDF or the like, and in some cases a piezoelectric constant may decrease significantly. However, a piezoelectric constant of the PLLA is extremely stable over time. Therefore, it is possible to detect a displacement caused by pressing with high sensitivity without being affected by a surrounding environment.

Further, as shown in FIG. 3(B), the first piezoelectric film 111 and the second piezoelectric film 112 may be made of films formed of two different types of chiral polymers. For example, poly-L-lactic acid (PLLA) may be used as the first piezoelectric film 111 and poly-D-lactic acid (PDLA) may be used as the second piezoelectric film 112. In this case, the uniaxial stretching directions are the same direction forming an angle of 45 degrees with respect to the X direction and the Y direction, as shown by arrows in FIG. 3(B). This angle of 45 degrees includes, for example, an angle of about 45 degrees±10 degrees. In this manner, a potential generated when the first piezoelectric film 111 is pressed and a potential generated when the second piezoelectric film 112 is pressed have opposite polarities.

As shown in FIG. 3(C), the first piezoelectric film 111 and the second piezoelectric film 112 may be a film formed of ferroelectrics in which ions are polarized, such as PVDF or PZT subjected to polling processing. For example, as shown in FIG. 3(C), PVDF charged positively on an upper side in the Z direction may be used as the first piezoelectric film 111 and PVDF charged negatively on an upper side in the Z direction may be used as the second piezoelectric film 112. In this manner, a potential generated when the first piezoelectric film 111 is pressed and a potential generated when the second piezoelectric film 112 is pressed have opposite polarities.

An electrode based on metal, such as aluminum and copper, is preferably used for the electrode 121, the electrode 122, and the electrode 123 formed on both principal surfaces of the first piezoelectric film 111 and the second piezoelectric film 112. Aluminum and copper have high conductivity. Therefore, the electrode 121, the electrode 122, and the electrode 123 can detect charges generated by deformation of the first piezoelectric film 111 and the second piezoelectric film 112 with high sensitivity. In a case where transparency is required for the piezoelectric element 10, ITO, PEDOT, or the like may be used to make the electrode 121, the electrode 122, and the electrode 123 transparent. PLLA and PDLA are highly transparent. Therefore, transparency of the piezoelectric element 10 can be enhanced. By providing the electrode 121, the electrode 122, and the electrode 123 described above, charges generated by the first piezoelectric film 111 and the second piezoelectric film 112 can be acquired as a potential difference, and a pressing amount detection signal of a voltage value corresponding to a pressing amount can be output to the outside.

Figure 4A:
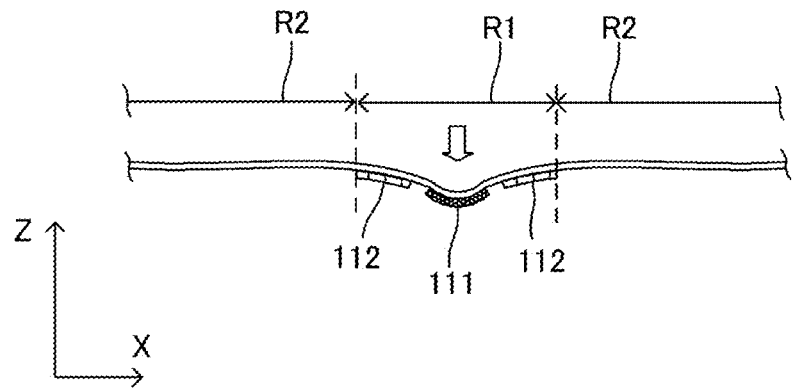
FIGS. 4(A) to 4(C) are diagrams for explaining a relationship between a position at which a pressing operation of the piezoelectric device according to the first embodiment is received and a generated potential.
Figure 4B:
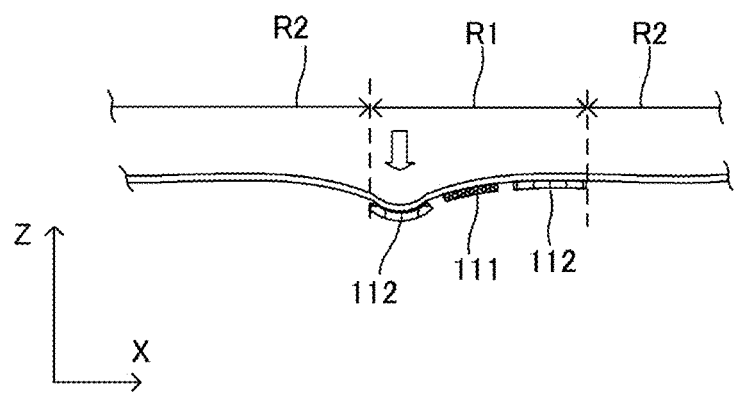
Figure 4C:
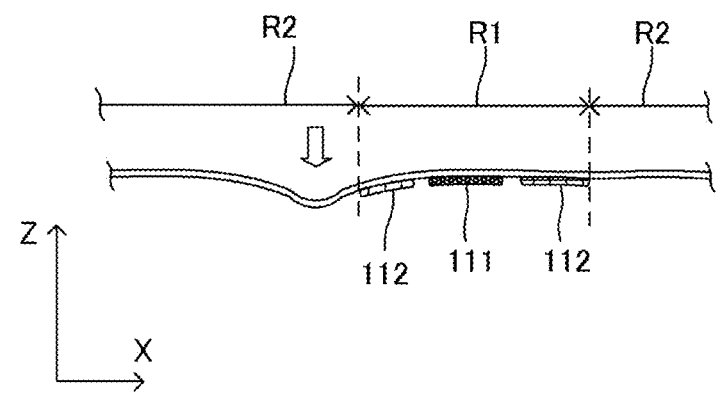

A potential generated when the piezoelectric device 100 receives a pressing operation will now be described. FIGS. 4(A) to 4(C) are diagrams for explaining a relationship between a position at which the piezoelectric device 100 according to the first embodiment receives a pressing operation and a potential generated in response thereto. Here, a case where there is only one first region R1 will be described. In FIGS. 4(A) to 4(C), only the periphery of the first pressing portion 5 of the piezoelectric device 100 is enlarged and displayed.

As shown in FIG. 4(A), when the first piezoelectric film 111 disposed in the first region R1 locally receives a pressing operation at about the center of the region R1, the first piezoelectric film 111 is significantly distorted downward in the Z-axis direction creating a relatively large positive charge. The second piezoelectric film 112 is also distorted downwardly, but to a lesser degree than the first piezoelectric film 111. In addition, the second piezoelectric film 112 has some components of upward distortion with the result that the second piezoelectric film 112 generates some positive charges and some negative charge. A positive potential which is the sum of potentials generated on the first and second piezoelectric films 111 and 112 is output.

FIG. 4(B) shows an example where the pressing operation is applied to the left hand side (as viewed in FIG. 4(B)) of the first regions R1. In this case, the second piezoelectric film 112 is significantly distorted downward in the Z-axis direction and a relatively large charge is generated by the portion of the second piezoelectric film 112 where a pressing operation is received. As the portion of the second piezoelectric film 112 receiving the pressing operation is distorted, some distortion occurs upward in the Z-axis direction on the first piezoelectric film 111 and the second piezoelectric film 112 existing in the vicinity. At this time, since the second piezoelectric film 112 is significantly distorted downward in the Z-axis direction, for example, a negative potential is detected on the electrode 123 corresponding to the distorted location. On the other hand, since a portion of the second piezoelectric film 112 not receiving the pressing operation is distorted upward in the Z-axis direction, a relatively small positive potential is generated on the electrode 123 corresponding to a portion of the second piezoelectric film 112 not receiving the pressing operation as compared with a portion receiving a pressing operation. Therefore, a potential generated on the electrode 123 corresponding to the entire second piezoelectric film 112 is partly canceled by positive and negative, and becomes smaller than a negative potential generated only in a portion of the second piezoelectric film 112 where a pressing operation is received. In addition, since a slight distortion is also generated upward in the Z-axis direction on the first piezoelectric film 111, a negative potential is generated on the electrode 122 corresponding to the first piezoelectric film 111. As a result, as the piezoelectric device 100 as a whole, a negative potential which is the sum of potentials generated on the first piezoelectric film 111 and the second piezoelectric film 112 is output.

FIG. 4(C) shows an example where the pressing operation occurs at a position outside of the region R1 (in the example shown, to the left of the second piezoelectric film 112, i.e., in the second region R2. In this case, both the first piezoelectric film 111 and the second piezoelectric film 112 are somewhat distorted upward in the Z-axis direction. Charges are generated in opposite directions on the first piezoelectric film 111 and the second piezoelectric film 112. Therefore, a negative potential is detected on the electrode 122 corresponding to the first piezoelectric film 111, and a positive potential is detected on the electrode 123 corresponding to the second piezoelectric film 112. The sum of positive and negative potentials generated on the first and second piezoelectric films 111 and 112 is canceled and almost no potential is detected in the piezoelectric device 100 as a whole.

As described above, a potential detected in the piezoelectric device 100 varies depending on a position pressed by an operator. That is, when the first region R1 receives a pressing operation, the piezoelectric device 100 outputs a relatively strong potential as compared with when the second region R2 receives a pressing operation. Therefore, depending on the magnitude of a potential output by the piezoelectric element 10, it can be clearly determined whether or not the first region R1 is pressed. As a result, it is possible to detect local deformation of a specific region.

Note that, even in a case where two pressing portions 5 and 6 are provided, it is possible to determine which of the pressing regions has been pressed (i.e., which is the first region R1) by the relative potentials detected in the piezoelectric device 100. Each region can be discriminated since potentials of opposite polarities are detected between the case where the first pressing portion 5 is pressed and the case where the second pressing portion 6 is pressed. For example, when the first pressing portion 5 is pressed, the first pressing portion 5 is in a state shown in FIG. 4(A) or FIG. 4(B), and the second pressing portion 6 is in a state shown in FIG. 4(C). At this time, a positive potential is detected on the piezoelectric element 10 corresponding to the first pressing portion 5, and a positive potential is detected on the piezoelectric element 10 corresponding to the second pressing portion 6. Conversely, when the second pressing portion 6 is pressed, a negative potential is detected on the piezoelectric element 10 corresponding to the first pressing portion 5, and a negative potential is detected on the piezoelectric element 10 corresponding to the second pressing portion 6. As a result, the polarity of a potential output by the piezoelectric device 100 as a whole differs between the case where the first pressing portion 5 is pressed and the case where the second pressing portion 6 is pressed. Accordingly, it is possible to determine which of the pressing portions is pressed. It should be noted that even when a potential of the same polarity is detected between the case where the first pressing portion 5 is pressed and the case where the second pressing portion 6 is pressed, the detected potential is inverted later so as to be calculated. For example, a potential output by the piezoelectric device 100 as a whole can be calculated by subtracting a potential detected by the piezoelectric element 10 corresponding to the second pressing portion 6 from a potential detected by the piezoelectric element 10 corresponding to the first pressing portion 5. For the sake of description, it is assumed that, when the first pressing portion 5 or the second pressing portion 6 is pressed, a positive potential is detected on the piezoelectric element 10 corresponding to the pressing portion that is pressed. For example, when the first pressing portion 5 is pressed, the first pressing portion 5 is in a state shown in FIG. 4(A) or FIG. 4(B), and the second pressing portion 6 is in a state shown in FIG. 4(C). At this time, a positive potential is detected on the piezoelectric element 10 corresponding to the first pressing portion 5, and a negative potential is detected on the piezoelectric element 10 corresponding to the second pressing portion 6. Conversely, when the second pressing portion 6 is pressed, a negative potential is detected on the piezoelectric element 10 corresponding to the first pressing portion 5, and a positive potential is detected on the piezoelectric element 10 corresponding to the second pressing portion 6. As a result, since a potential output by the piezoelectric device 100 as a whole differs depending on a case where the first pressing portion 5 is pressed and a case where the second pressing portion 6 is pressed, it is possible to determine which of the pressing portions is pressed. Further, when the first pressing portion 5 and the second pressing portion 6 are disposed close to each other, it is preferable to use the same piezoelectric element 10 for the first pressing portion 5 and the second pressing portion 6. For example, both the piezoelectric elements 10 disposed on the first pressing portion 5 and the second pressing portion 6 include the first piezoelectric film 111 at 45° and the second piezoelectric film 112 at 135° in a stretching axis direction viewed from the operation surface side when the X axis positive direction is set to 0° as shown in FIG. 3(A). Thus, even when the first pressing portion 5 and the second pressing portion 6 are disposed close to each other, the second piezoelectric films 112 of the portions come close to each other, so that a signal can be output without being canceled. That is, by using the similar piezoelectric elements 10, it is possible to arrange the first pressing portion 5 and the second pressing portion 6 close to each other. Conversely, when the first pressing portion 5 and the second pressing portion 6 are separated, it is possible to determine which of the first pressing portion 5 and the second pressing portion 6 is pressed based on a difference in output levels regardless of a direction of a charge of an output of the piezoelectric elements 10 of the portions. Therefore, different piezoelectric elements can be used for the first pressing portion 5 and the second pressing portion 6.

Further, in the first embodiment, both the first piezoelectric film 111 and the second piezoelectric film 112 are disposed in the first region R1. However, the second piezoelectric film 112 is not necessarily disposed in the first region R1, and may be disposed in proximity to the first region R1. When a portion corresponding to the first piezoelectric film 111 is pressed, a relatively large potential is detected as compared with a case where a portion corresponding to the second piezoelectric film 112 is pressed. Therefore, a relatively large potential is output only in a case where a portion corresponding to the first piezoelectric film 111 is pressed. Accordingly, locally limited deformation of a specific region can be detected.

FIGS. 5(A) to 10(A) are exploded perspective views showing the piezoelectric elements according to second to seventh embodiments of the invention. FIGS. 5(B) to 10(B) are cross-sectional views on an X-Z plane of FIGS. 5(A) to 10(A), respectively.

Figure 5A:
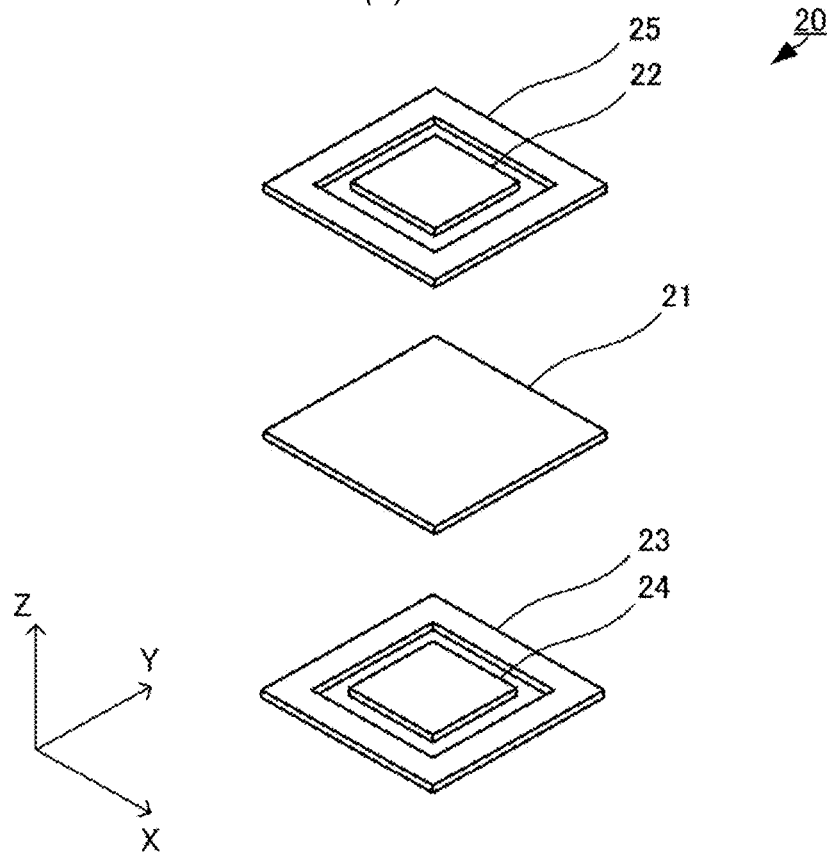
FIG. 5(A) is an exploded perspective view showing the piezoelectric element according to a second embodiment.
Figure 5B:
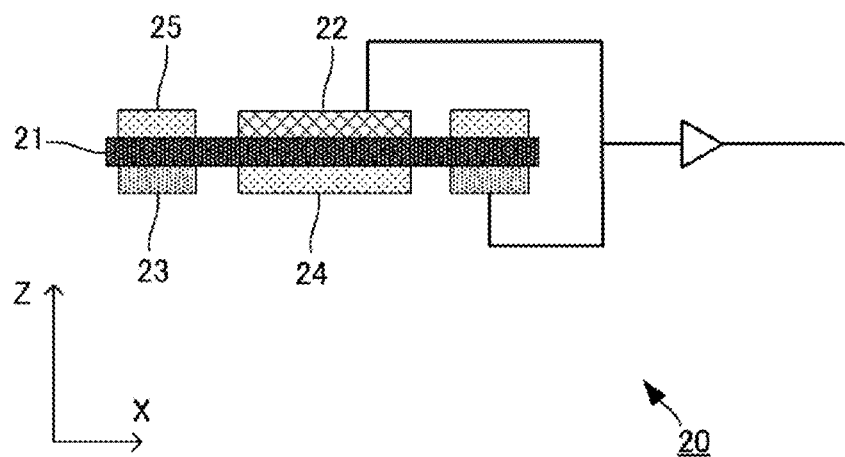
FIG. 5(B) is a cross-sectional view on an X-Z plane of the piezoelectric element.

FIG. 5(A) is an exploded perspective view of a piezoelectric element 20 according to the second embodiment, and FIG. 5(B) is a cross-sectional view on an X-Z plane of the piezoelectric element 20. As shown in FIGS. 5(A) and 5(B), the piezoelectric element 20 according to the second embodiment includes a flat film-like piezoelectric film 21, a first detection electrode 22, and a second detection electrode 23 that has polarity different from that of the first detection electrode 22. The first detection electrode 22 is formed on an upper side in the Z direction of the piezoelectric film 21 (on a first principal surface side of the piezoelectric film 21), and the second detection electrode 23 is formed on a lower side in the Z direction of the piezoelectric film 21 (a second principal surface side of the piezoelectric film 21). The first detection electrode 22 and the second detection electrode 23 are disposed in the first region R1. The piezoelectric film 21 has a square shape similar to a surface of the first region R1, that is, the first pressing portion 5 and the second pressing portion 6, in plan view, and an outer periphery of the piezoelectric film 21 is formed to substantially coincide with that of the first pressing portion 5 or the second pressing portion 6.

The piezoelectric element 20 further includes an electrode 24 paired with the first detection electrode 22 and an electrode 25 paired with the first detection electrode 22. The electrode 24 is formed on a second principal surface side of the piezoelectric film 21, and the electrode 25 is formed on the first principal surface side of the piezoelectric film 21. The electrode 25 is formed into a shape that encloses the first detection electrode 22 on the same plane as the first detection electrode 22. The electrode 23 is formed into a shape that encloses the second detection electrode 24 on the same plane as the second detection electrode 24.

The first detection electrode 22 is formed on the piezoelectric film 21 on a principal surface opposite to the principal surface on which the second detection electrode 23 is formed. Therefore, when the piezoelectric film 21 similarly receives a pressing operation from the same direction, the polarity of a potential detected by the first detection electrode 22 is opposite to that of a potential detected by the second detection electrode 23. Accordingly, a potential generated from the piezoelectric film 21 varies depending on a pressed position on the piezoelectric film 21. This makes it possible to reliably detect deformation of a specific region even on a single piezoelectric film.

Since the first detection electrode 22 and the second detection electrode 23 are disposed in the first region R1, it is possible to detect a potential generated in the first region R1. When part of the piezoelectric film 21 corresponding to the first detection electrode 22 receives a pressing operation, part of the piezoelectric film 21 is significantly distorted downward in the Z-axis direction. A charge is generated in a portion of the piezoelectric film 21 where the pressing operation is received, and for example, a positive potential is generated on the first detection electrode 22. At this time, a slight distortion is generated upward in the Z-axis direction in a portion of the piezoelectric film 21 corresponding to the second detection electrode 23, and a positive potential is generated on the second detection electrode 23. Therefore, in the piezoelectric device 100 as a whole, a positive potential which is the sum of potentials detected by the first detection electrode 22 and the second detection electrode 23 is detected.

When part of the piezoelectric film 21 corresponding to the first detection electrode 23 receives a pressing operation, part of the piezoelectric film 21 is significantly distorted downward in the Z-axis direction. A charge is generated in a portion of the piezoelectric film 21 where a pressing operation is received, and for example, a negative potential is output to the first detection electrode 23. In a portion that does not receive a pressing operation in the piezoelectric film 21 corresponding to the first detection electrode 22, some distortion is generated upward in the Z-axis direction, and a charge is generated. At this time, a positive potential is generated on the first detection electrode 22. Further, in a portion of the piezoelectric film 21 corresponding to the second detection electrode 23, a slight distortion is generated upward in the Z-axis direction and a charge is generated. At this time, a negative potential is generated on the second detection electrode 23. Therefore, on the piezoelectric device 100 as a whole, a negative potential which is the sum of potentials detected by the first detection electrode 22 and the second detection electrode 23 is detected.

When a pressing operation is received in the second region R2, some distortion is generated upward in the Z-axis direction on the piezoelectric film 21 corresponding to the first detection electrode 22 and the piezoelectric film 21 corresponding to the second detection electrode 23 in a similar manner, and a charge is generated. At this time, a positive potential is generated on the first detection electrode 22, and a negative potential is generated on the second detection electrode 23. Therefore, the sum of potentials generated on the entire piezoelectric film 21 is canceled out by positive and negative, and almost no potential is detected. As a result, a potential detected on the piezoelectric device 100 as a whole varies depending on a position pressed by an operator. Accordingly, deformation of the first region R1 can be locally detected. Further, since the piezoelectric film 21 is configured with one sheet, the structure of the piezoelectric device 100 is simplified, which facilitates manufacturing.

Figure 6A:
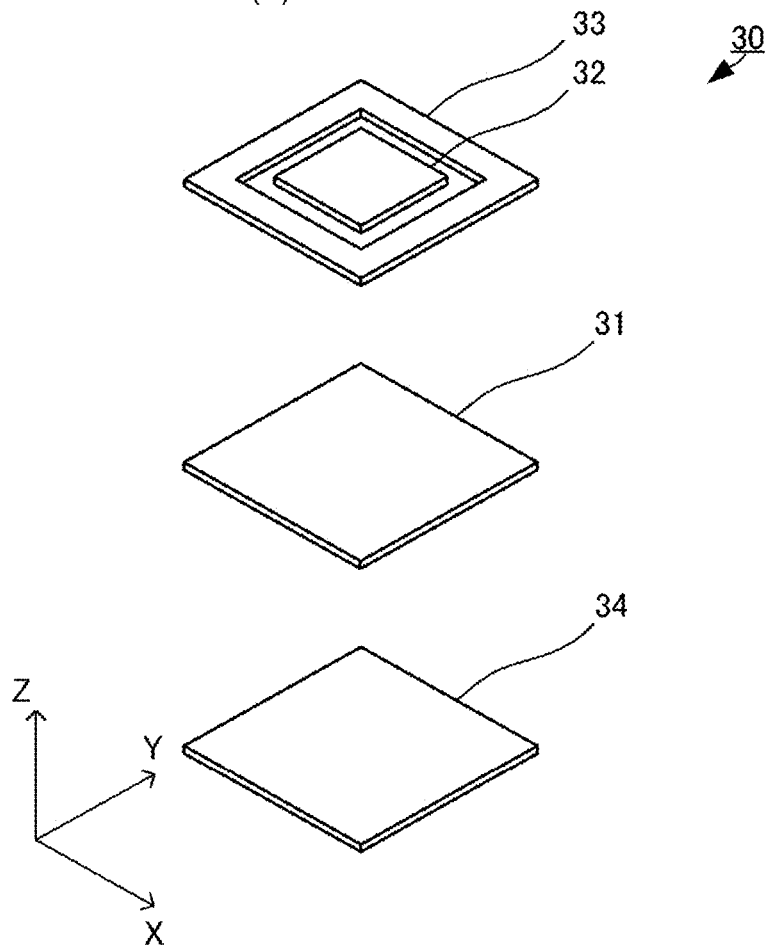
FIG. 6(A) is an exploded perspective view showing the piezoelectric element according to a third embodiment.
Figure 6B:
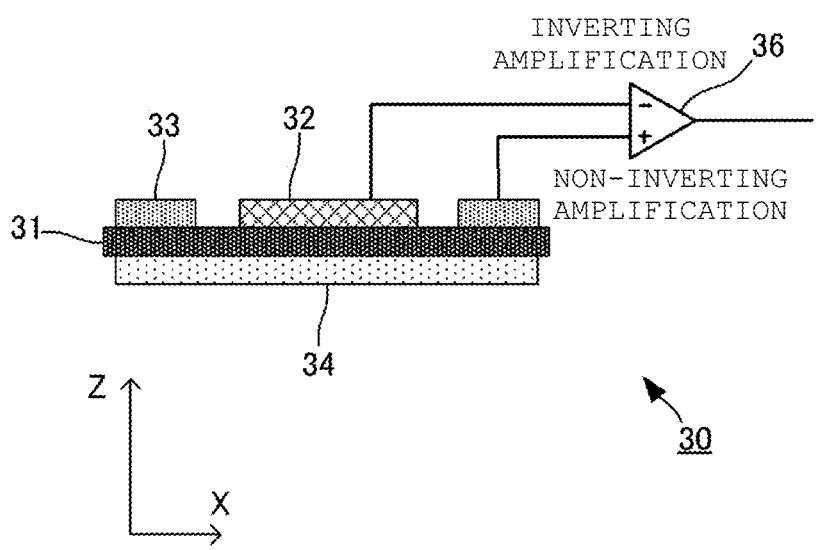
FIG. 6(B) is a cross-sectional view on an X-Z plane of the piezoelectric element.

FIG. 6(A) is an exploded perspective view of a piezoelectric element 30 according to the third embodiment, and FIG. 6(B) is a cross-sectional view on an X-Z plane of the piezoelectric element 30. As shown in FIGS. 6(A) and 6(B), the piezoelectric element 30 according to the third embodiment includes an amplifier 36, a piezoelectric film 31, a first detection electrode 32, a second detection electrode 33, and an electrode 34. The first detection electrode 32 and the second detection electrode 33 are formed upward in the Z direction of the piezoelectric film 31 (a first principal surface side of the piezoelectric film 31). The electrode 34 is formed downward in the Z direction on the piezoelectric film 31 (a second principal surface side of the piezoelectric film 31). The first detection electrode 32 and the second detection electrode 33 are disposed in R1. The piezoelectric film 31 has a square shape similar to a surface of the first region R1, that is, the first pressing portion 5 and the second pressing portion 6, in plan view, and an outer periphery of the piezoelectric film 31 is formed to substantially coincide with that of the first pressing portion 5 or the second pressing portion 6.

The first detection electrode 32 is connected to an inverting input terminal of the amplifier 36, and the second detection electrode 33 is connected to a non-inverting input terminal of the amplifier 36. Therefore, since the first detection electrode 32 and the second detection electrode 33 are formed in the same direction on a principal surface of the piezoelectric film 31, manufacture is facilitated. Further, in the amplifier 36, the first detection electrode 32 is connected to the inverting input terminal, and the second detection electrode 33 is connected to the non-inverting input terminal. Therefore, when the piezoelectric film 31 similarly receives a pressing operation from the same direction, the polarity of a potential detected by the first detection electrode 32 is opposite to that of a potential detected by the second detection electrode 33. Accordingly, a potential output from the piezoelectric element 30 varies depending on a pressed position on the piezoelectric film 31. This makes it possible to reliably detect deformation of a specific region even on the single piezoelectric film 31.

Figure 7A:
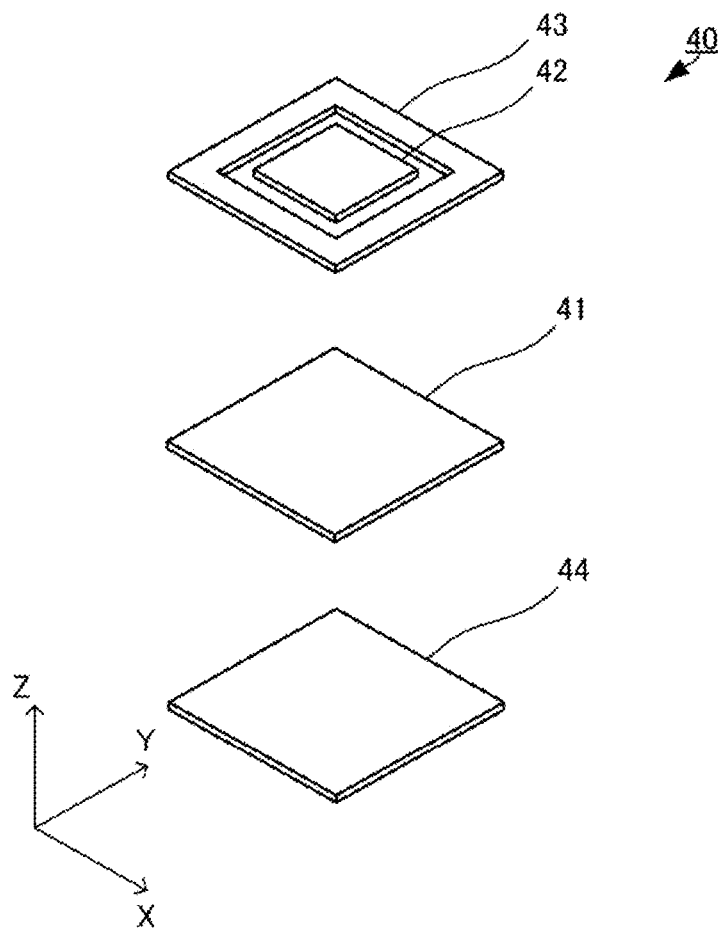
FIG. 7(A) is an exploded perspective view showing the piezoelectric element according to a fourth embodiment.
Figure 7B:
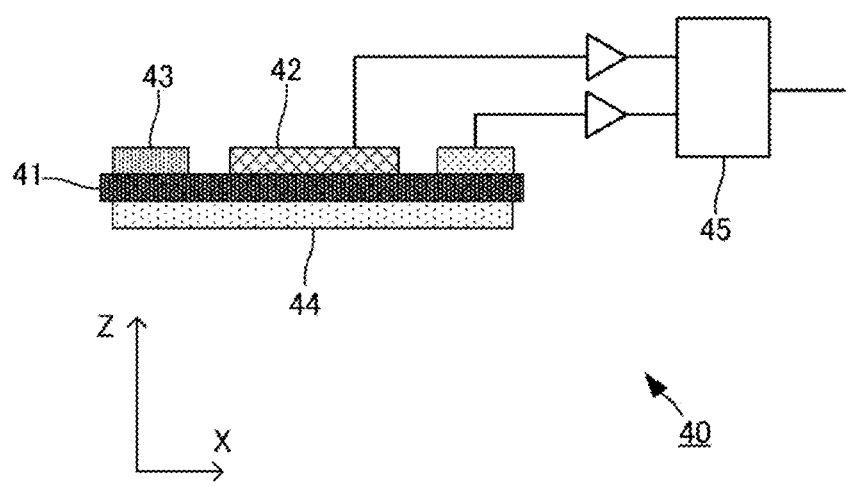
FIG. 7(B) is a cross-sectional view on an X-Z plane of the piezoelectric element.

FIG. 7(A) is an exploded perspective view of a piezoelectric element 40 according to the fourth embodiment, and FIG. 7(B) is a cross-sectional view on an X-Z plane of the piezoelectric element 40. As shown in FIGS. 7(A) and 7(B), the piezoelectric element 40 according to the fourth embodiment has a substantially similar configuration as the third embodiment except that a signal processing unit 45 is provided in place of the amplifier 36. That is, the piezoelectric element 40 includes a piezoelectric film 41, a first detection electrode 42, a second detection electrode 43, an electrode 44, and the signal processing unit 45. The signal processing unit 45 performs processing for inverting any of signals output from the first detection electrode 42 or the second detection electrode 43. As a result, since the first detection electrode 42 and the second detection electrode 43 are formed in the same direction on a principal surface of the piezoelectric film 41, manufacture is facilitated. In addition, any of signals detected by the first detection electrode 42 or the second detection electrode 43 is inverted by the signal processing unit 45. Therefore, when the piezoelectric film 41 similarly receives a pressing operation from the same direction, a potential detected by the first detection electrode 42 is opposite in polarity to a potential detected by the second detection electrode 43. Therefore, a potential output from the piezoelectric element 40 varies depending on a pressed position on the piezoelectric film 41. This makes it possible to reliably detect deformation of a specific region even on a single piezoelectric film.

Figure 8A:
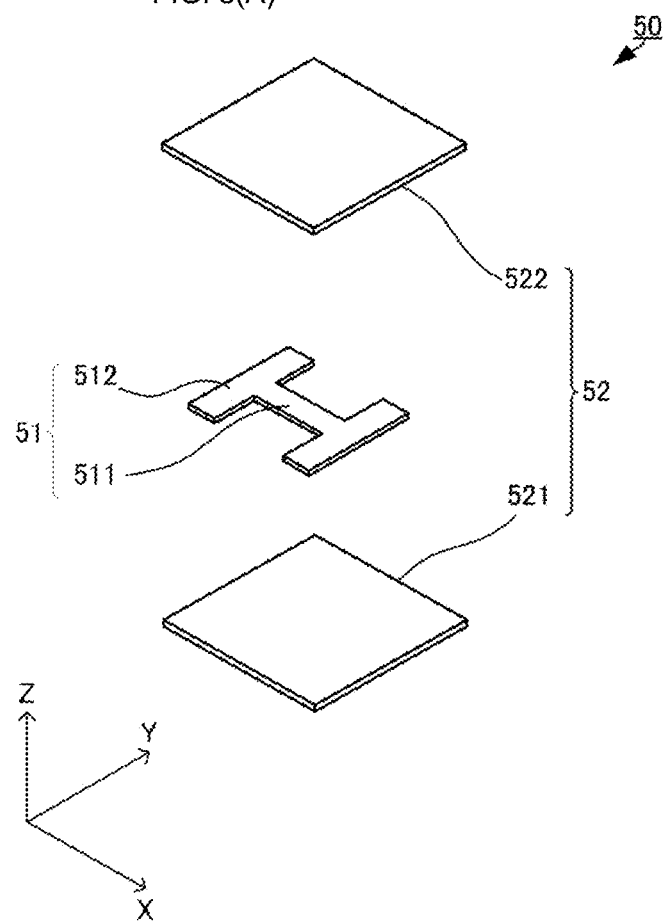
FIG. 8(A) is an exploded perspective view of the piezoelectric element according to a fifth embodiment.
Figure 8B:
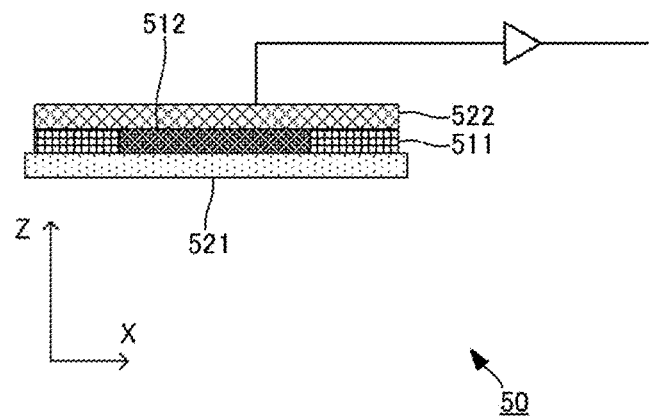
FIG. 8(B) is a cross-sectional view on an X-Z plane of the piezoelectric element.

FIG. 8(A) is an exploded perspective view of a piezoelectric element 50 according to the fifth embodiment, and FIG. 8(B) is a cross-sectional view on an X-Z plane of the piezoelectric element 50. As shown in FIGS. 8(A) and 8(B), the piezoelectric element 50 according to the fifth embodiment includes a piezoelectric film 51, and a pair of electrodes 52 (an electrode 521 and an electrode 522) formed on both principal surfaces of the piezoelectric film 51. The piezoelectric film 51 includes a third region 511 having a length in a first direction (X direction) along the principal surface of the piezoelectric film 51 longer than a length in a second direction (Y direction) perpendicular to the first direction, and a fourth region 512 having a length in the first direction (X direction) shorter than a length in the second direction (Y direction). The piezoelectric film 51 is disposed over the first region R1 or the first region and a proximity of the first region and includes a chiral polymer. Therefore, when the third region 511 is pressed, the third region 511 is significantly distorted in the first direction as compared with the second direction. On the other hand, when the fourth region 512 is pressed, the fourth region 512 is significantly distorted in the second direction as compared with the first direction. Further, since the piezoelectric film 51 includes a chiral polymer, the potential generated on the piezoelectric film 51 is inverted depending on a direction in which the piezoelectric film 51 expands and contracts. For this reason, a detected potential is different between the case where the third region 511 is pressed and the case where the fourth region 512 is pressed, and the polarities are inverted. Therefore, a pressed position on the piezoelectric film 51 can be accurately detected based on a detected potential.

Figure 9A:
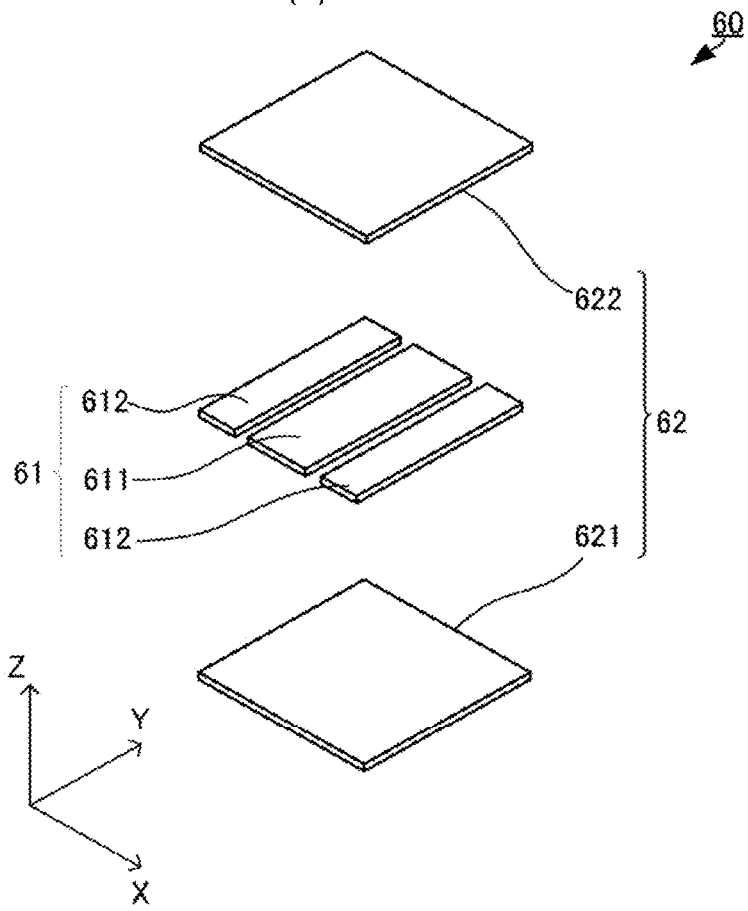
FIG. 9(A) is an exploded perspective view showing a piezoelectric element according to a sixth embodiment.
Figure 9B:
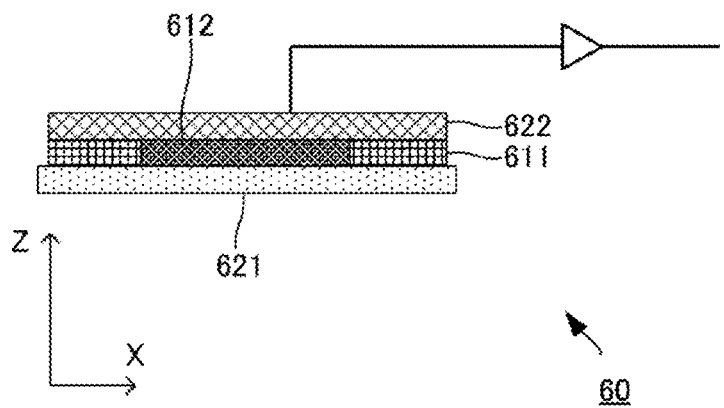
FIG. 9(B) is a cross-sectional view on an X-Z plane of the piezoelectric element.

FIG. 9(A) is an exploded perspective view of a piezoelectric element 60 according to the fifth embodiment, and FIG. 9(B) is a cross-sectional view on an X-Z plane of the piezoelectric element 60. As shown in FIGS. 9(A) and 9(B), the piezoelectric element 60 according to the fifth embodiment includes a piezoelectric film 61, and a pair of electrodes 62 (an electrode 621 and an electrode 622) formed on both principal surfaces of the piezoelectric film 61. The piezoelectric film 61 includes one piezoelectric film 611 and two piezoelectric films 612, which are formed in parallel on the same plane with the piezoelectric film 611 as the center. The piezoelectric film 611 is disposed in the first region R1. Further, the piezoelectric film 611 generates a potential having a polarity opposite to that of a potential generated by the piezoelectric film 612 when a pressing operation is received. As a result, a detected potential is different between the case where a region corresponding to the piezoelectric film 611 is pressed and the case where a region corresponding to the piezoelectric film 612 is pressed, and polarities are inverted. Therefore, a pressed position on the piezoelectric film 61 can be accurately detected based on the detected potential. Note that areas of the piezoelectric film 611 and the piezoelectric film 612 are appropriately designed as required. However, it is particularly preferable to equalize the areas of the piezoelectric film 611 and the piezoelectric film 612. In this case, an output when the second region is pressed can be further reduced, which is preferable. Further, in a case of a piezoelectric film whose output depends on a shape (for example, an aspect ratio, and the like), it is desirable that the areas of the piezoelectric film 611 and the piezoelectric film 612 are made equal and similar in shape. Thus, it is possible to further reduce an output when the second region is pressed.

Figure 10A:
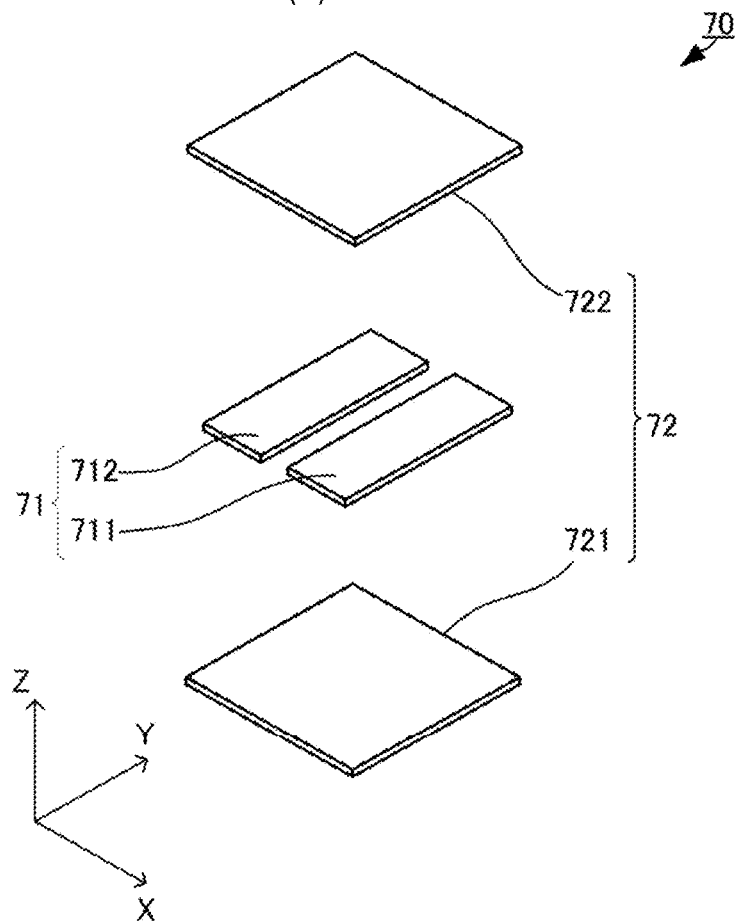
FIG. 10(A) is an exploded perspective view showing a piezoelectric element according to a seventh embodiment.
Figure 10B:
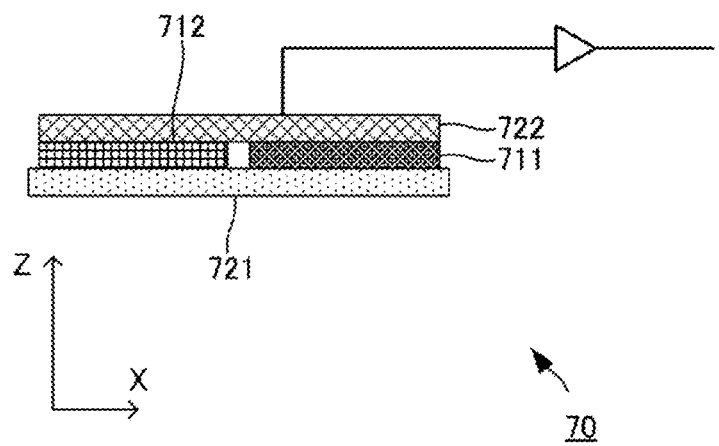
FIG. 10(B) is a cross-sectional view on an X-Z plane of the piezoelectric element.

FIG. 10(A) is an exploded perspective view of a piezoelectric element 70 according to the fifth embodiment, and FIG. 10(B) is a cross-sectional view on an X-Z plane of the piezoelectric element 70. As shown in FIGS. 10(A) and 10(B), the piezoelectric element 70 according to the fifth embodiment includes a piezoelectric film 71, and a pair of electrodes 72 (an electrode 721 and an electrode 722) formed on both principal surfaces of the piezoelectric film 71. The piezoelectric film 71 includes one piezoelectric film 711 and one piezoelectric film 712, which are formed in parallel on the same plane. The piezoelectric film 71 is arranged in the first region R1. Further, the piezoelectric film 711 generates a potential having a polarity opposite to that of a potential generated by the piezoelectric film 712 when a pressing operation is received. A detected potential is different between the case where a region corresponding to the piezoelectric film 711 is pressed and the case where a region corresponding to the piezoelectric film 712 is pressed, and polarities are inverted. Therefore, a pressed position on the piezoelectric film 71 can be accurately detected based on a detected potential. This makes it possible to configure buttons with options, such as "raising" or "lowering" a temperature, and the like. It should be noted that the piezoelectric device of the present invention can also be applied to electronic devices other than a display device, that is, those without a display.

Finally, the description of the above-described embodiments is to be considered in all respects as illustrative and not restrictive. The scope of the present invention is indicated not by the above-described embodiments but by the claims. Furthermore, the scope of the present invention includes the scope equivalent to the claims.

DESCRIPTION OF REFERENCE SYMBOLS

1: display device
10, 20, 30, 40, 50, 60, 70: piezoelectric element
12, 52: electrode
21, 31, 41, 51, 61, 71: piezoelectric film
22, 32, 42: first detection electrode 23, 33, 43: second detection electrode
34: amplifier
45: signal processing unit
100: piezoelectric device
111: first piezoelectric film
112: second piezoelectric film
511: third region
512: fourth region
R1: first region
R2: second region

The invention claimed is:

1. A piezoelectric device comprising:
a first region on the piezoelectric device for receiving a pressing operation;
a second region on the piezoelectric device located outside of the first region; and
a piezoelectric element that outputs a larger potential when the pressing operation is applied to the first region than when the pressing operation is applied to the second region; the piezoelectric element including:
a first piezoelectric film disposed in the first region;
a second piezoelectric film that is disposed in the first region or in proximity to the first region and is configured to generate a potential having a polarity that is opposite to the polarity of a potential generated by the first piezoelectric film when the pressing operation is applied to the first region of the piezoelectric device; and
electrodes formed on opposed principal surfaces of the first piezoelectric film and the second piezoelectric film.

2. The piezoelectric device according to claim 1, wherein:
(a) the first piezoelectric film has first and second opposed principal surfaces and a polarity extending from the first to the second principle surface;
(b) the second piezoelectric film has third and fourth principle surfaces and a polarity extending from the third to the fourth principal surface, the first and second piezoelectric films being oriented relative to one another such that the polarity of the first and second piezoelectric films are opposed to one another; and
(c) the electrodes include:
(i) a first detection electrode disposed on the first principal surface of the first piezoelectric film;
(ii) a second detection electrode disposed on the third principal surface of the second piezoelectric film; and
(iii) a third detection electrode disposed on the second and fourth principal surfaces of the first and second piezoelectric films.

3. The piezoelectric device according to claim 2, wherein:
the piezoelectric device includes an amplifier having inverting and non-inverting input terminals;
the first detection electrode is electrically connected to one of the inverting and non-inverting input terminals of the amplifier; and
the second detection electrode is electrically connected to the other of the inverting and non-inverting input terminals of the amplifier.

4. The piezoelectric device according to claim 1 wherein there are a plurality of first regions.

5. A display device using the piezoelectric device according to claim 2.

6. The piezoelectric device according to claim 1, wherein the second piezoelectric element surrounds the first piezoelectric element.

7. The piezoelectric device according to claim 1, wherein the first piezoelectric element are elongated elements having respective elongated axes which run parallel to one another.

8. The piezoelectric device according to claim 7, further comprising a third piezoelectric element located in the first region, the third piezoelectric element being an elongated element with an elongated axis which runs parallel to the elongated axes of the first and second piezoelectric elements.

9. The piezoelectric device according to claim 8, wherein the first, second and third piezoelectric elements all have respective rectangular shapes.

10. The piezoelectric device according to claim 7, wherein the first and second piezoelectric elements each have respective rectangular shapes.

11. The piezoelectric device according to claim 10, wherein the first and second piezoelectric elements have the same rectangular shape.

12. A piezoelectric device comprising:
(a) a first region on the piezoelectric device for receiving a pressing operation;
(b) a second region on the piezoelectric device located outside of the first region; and
(c) a piezoelectric element that outputs a larger potential when the pressing operation is applied to the first region than when the pressing operation is applied to the second region, the piezoelectric element including:
(i) a piezoelectric film having first and second principal surfaces;
(ii) first and second detection electrodes located on the first principal surface of the piezoelectric film, the second electrode having a different polarity than the first electrode; and
a signal processing unit
which performs processing of inverting any signals output by the first or second detection electrodes.

13. A display device using the piezoelectric device according to claim 12.

14. The piezoelectric device according to claim 12, wherein the first electrode surrounds the second electrode.

15. The piezoelectric device according to claim 14, wherein both the first and second electrodes have quadrilateral outer shapes.

16. The piezoelectric device according to claim 12, further comprising a third electrode located on the second principal surface of the piezoelectric film.

17. A piezoelectric device comprising:
a first region on the piezoelectric device for receiving a pressing operation;
a second region on the piezoelectric device located outside of the first region; and
a piezoelectric element that outputs a larger potential when the pressing operation is applied to the first region than when the pressing operation is applied to the second region, the piezoelectric element including a piezoelectric film that is disposed over the first region, the piezoelectric film including a chiral polymer;
first and second electrodes formed on respective opposed principal surfaces of the piezoelectric film; and
the piezoelectric film having a third region in which a length in a first direction along one of the principal surface of the piezoelectric film is longer than a length in a second direction orthogonal to the first direction, and a fourth region in which a length in the first direction is longer than a length in the second direction.

18. A display device using the piezoelectric device according to claim 17.

19. The piezoelectric device according to claim 17, wherein the piezoelectric film is in the shape of the letter H.

\* \* \* \* \*